US012568734B2

(12) United States Patent
Yao et al.

(10) Patent No.: US 12,568,734 B2
(45) Date of Patent: Mar. 3, 2026

(54) DISPLAY PANEL, METHOD OF FABRICATING SAME AND DISPLAY DEVICE

(71) Applicant: TCL China Star Optoelectronics Technology Co., Ltd., Shenzhen (CN)

(72) Inventors: Jiangbo Yao, Shenzhen (CN); Macai Lu, Shenzhen (CN); Juan Liu, Shenzhen (CN); Shouqing Chen, Shenzhen (CN); Qingqing Ou, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 603 days.

(21) Appl. No.: 17/994,076

(22) Filed: Nov. 25, 2022

(65) Prior Publication Data

US 2024/0138186 A1    Apr. 25, 2024
US 2024/0237401 A9    Jul. 11, 2024

(30) Foreign Application Priority Data

Oct. 25, 2022    (CN) .......................... 202211310327.X

(51) Int. Cl.
H10K 59/121        (2023.01)
H10D 86/40        (2025.01)
(Continued)

(52) U.S. Cl.
CPC ....... H10K 59/1213 (2023.02); H10D 86/421 (2025.01); H10D 86/60 (2025.01); H10K 59/1201 (2023.02)

(58) Field of Classification Search
CPC .. H10K 59/1213; H10K 59/12; H10D 86/421; H10D 86/60
See application file for complete search history.

(56) References Cited

U.S. PATENT DOCUMENTS 5,539,219 A       7/1996  Den Boer et al.
2018/0249046 A1*  8/2018  Son ...................... H10H 29/142
(Continued)

FOREIGN PATENT DOCUMENTS

CN      103199112      7/2013
CN      103618004      3/2014
(Continued)

OTHER PUBLICATIONS

Notification of Office Action and Search Report Dated Dec. 1, 2022 From the State Intellectual Property Office of the People's Republic of China Re. Application No. 202211310327.X and Its Translation Into English. (23 Pages).
(Continued)

*Primary Examiner* — Jeff W Natalini
*Assistant Examiner* — Andrew Zabel

(57)        ABSTRACT

A display panel includes a substrate, an active layer, a first metal layer and a second metal layer. The active layer is disposed on the substrate and includes a plurality of the driving active portions, and each driving active portion comprises a conductor sub-layer and a first semiconductor sub-layer. The first metal layer is disposed on a side of the active layer away from the substrate and includes a plurality of the driving gates, one of the plurality of the driving gates is correspondingly located on a side of the driving active portion away from the substrate. The second metal layer disposed on a side of the first metal layer away from the active layer and includes a plurality of the driving source electrodes and a plurality of the driving drain electrodes. The conductor sub-layer includes a first conductor sub-portion and a second conductor sub-portion arranged at intervals.

14 Claims, 6 Drawing Sheets

(51) Int. Cl.
    *H10D 86/60*     (2025.01)
    *H10K 59/12*     (2023.01)

(56)         References Cited

U.S. PATENT DOCUMENTS

| | | | | |
|---|---|---|---|---|
| 2020/0185489 | A1* | 6/2020 | Jo | H10K 59/35 |
| 2020/0321427 | A1* | 10/2020 | Park | H10K 59/131 |
| 2021/0202648 | A1* | 7/2021 | Zhang | H10D 30/6732 |
| 2021/0375954 | A1* | 12/2021 | Lee | H10D 86/60 |
| 2021/0384280 | A1* | 12/2021 | Akiyama | G06F 1/1626 |
| 2022/0208923 | A1* | 6/2022 | Kim | H10K 59/124 |

FOREIGN PATENT DOCUMENTS

| | | |
|---|---|---|
| CN | 104167447 | 11/2014 |
| CN | 104241392 | 12/2014 |
| CN | 105308752 | 2/2016 |
| CN | 113345916 | 9/2021 |
| CN | 113871400 | 12/2021 |
| CN | 114388625 | 4/2022 |
| CN | 114883343 | 8/2022 |

OTHER PUBLICATIONS

Notification of Office Action and Search Report Dated Dec. 22, 2022 From the State Intellectual Property Office of the People's Republic of China Re. Application No. 202211310327.X and Its Translation Into English. (26 Pages).

Notification of Decision of Rejection Dated Mar. 24, 2023 From the State Intellectual Property Office of the People's Republic of China Re. Application No. 202211310327.X and Its Translation Into English. (22 Pages).

Notification of Office Action Dated Jan. 1, 2023 From the State Intellectual Property Office of the People's Republic of China Re. Application No. 202211310327.X and Its Translation Into English. (21 Pages).

* cited by examiner

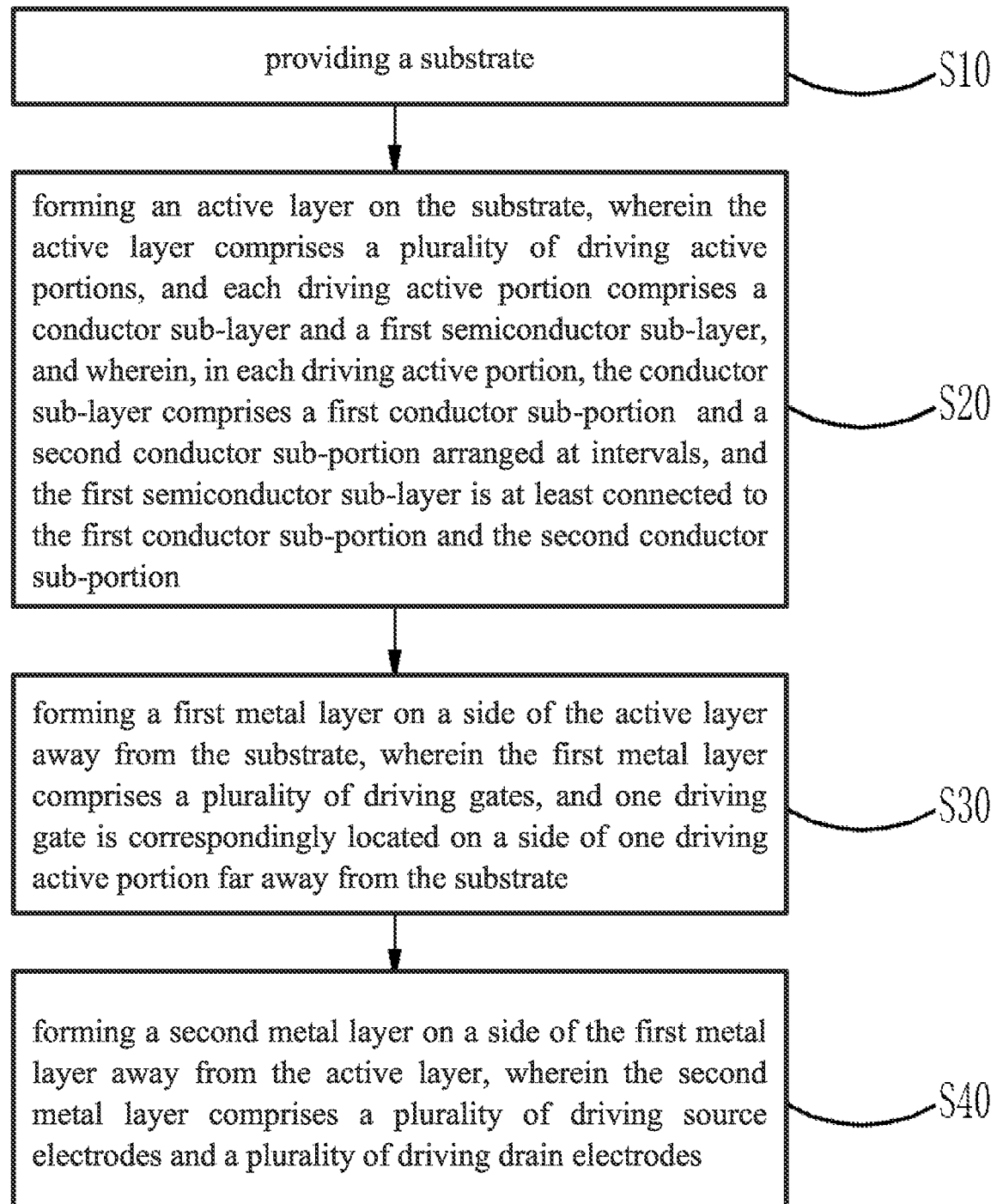

providing a substrate — S10 forming an active layer on the substrate, wherein the active layer comprises a plurality of driving active portions, and each driving active portion comprises a conductor sub-layer and a first semiconductor sub-layer, and wherein, in each driving active portion, the conductor sub-layer comprises a first conductor sub-portion and a second conductor sub-portion arranged at intervals, and the first semiconductor sub-layer is at least connected to the first conductor sub-portion and the second conductor sub-portion — S20 forming a first metal layer on a side of the active layer away from the substrate, wherein the first metal layer comprises a plurality of driving gates, and one driving gate is correspondingly located on a side of one driving active portion far away from the substrate — S30 forming a second metal layer on a side of the first metal layer away from the active layer, wherein the second metal layer comprises a plurality of driving source electrodes and a plurality of driving drain electrodes — S40

DISPLAY PANEL, METHOD OF FABRICATING SAME AND DISPLAY DEVICE

RELATED APPLICATION

This application claims the benefit of priority of China Patent Application No. 202211310327.X filed on Oct. 25, 2022, the contents of which are incorporated by reference as if fully set forth herein in their entirety.

FIELD OF INVENTION

The invention relates to the field of display technology, and particularly to a display panel, a method of fabricating the same and a display device.

BACKGROUND

Display technologies such as organic light-emitting diode (OLED), micro LED (Micro LED) and mini LED (Mini LED) are emerging display technologies that use current-driven displays.

Among them, electric signals in display devices such as OLED, Micro LED, and Mini LED are transmitted to an organic light-emitting layer or a LED chip through driving transistors, so as to realize light emission of the display device. Therefore, the driving transistors need to have a large current passing capacity, and existing driving transistors often use an oxide semiconductor material as an active layer. If the current passing capacity of the driving transistor needs to be improved, the mobility of the oxide semiconductor material needs to be improved. However, when the oxide semiconductor material improves the mobility, the stability will be reduced, resulting in an unbalanced stability and mobility of the driving transistor, and the current passing capability of the driving transistor cannot be effectively improved.

SUMMARY

Embodiments of the present invention provide a display panel and a method of fabricating same, which can realize a driving transistor with a short channel and improve the current passing capability of the driving transistor.

Embodiments of the present invention provide a display panel, comprising a plurality of driving transistors, wherein each driving transistor comprises a driving active portion, a driving gate, and a driving source electrode and a driving drain electrode connected to the driving active portion;

a substrate;

an active layer disposed on the substrate, wherein the active layer comprises a plurality of driving active portions, and each driving active portion comprises a conductor sub-layer and a first semiconductor sub-layer;

a first metal layer disposed on a side of the active layer away from the substrate, wherein the first metal layer comprises a plurality of driving gates, one driving gate is correspondingly located on a side of the driving active portion away from the substrate;

a second metal layer disposed on a side of the first metal layer away from the active layer, wherein the second metal layer comprises a plurality of driving source electrodes and a plurality of driving drain electrodes;

wherein, in each driving active portion, the conductor sub-layer comprises a first conductor sub-portion and a second conductor sub-portion arranged at intervals, and the first semiconductor sub-layer is at least connected to the first conductor sub-layer section and the second conductor sub-portion.

In an embodiment of the present invention, each driving active portion comprises a source contact region, a drain contact region, and a channel region located between the source contact region and the drain contact region, and the conductor sub-layer further comprises an isolation trench disposed between the first conductor sub-portion and the second conductor sub-portion and located in the channel region;

wherein the first semiconductor sub-layer is at least filled in the isolation trench, at least the first conductor sub-portion extends to the source contact region, and at least the second conductor sub-portion extends to the drain contact area.

In an embodiment of the present invention, one driving source electrode is electrically connected to the first conductor sub-portion of one corresponding driving active portion, and one driving drain electrode is electrically connected with the second conductor sub-portion of one corresponding driving active portion.

In an embodiment of the present invention, one driving source electrode is electrically connected to a portion of the driving active portion located in the source contact region, and one driving drain electrode is electrically connected to a portion of the driving active portion located in the drain contact region.

In an embodiment of the present invention, the first semiconductor sub-layer is filled in the isolation trench and partially extends to the source contact region and the drain contact region, the first semiconductor sub-layer comprises a source contact sub-portion at least disposed in the source contact region and located on a side of the first conductor sub-portion away from the substrate, and a drain contact sub-portion at least disposed in the drain contact region and located on a side of the second conductor sub-portion away from the substrate, the source contact sub-portion is electrically connected to the first conductor sub-portion, and the drain contact sub-portion is electrically connected to the second conductor sub-portion.

In an embodiment of the present invention, one driving source electrode is electrically connected to the source contact sub-portion of one corresponding driving active portion, and one driving drain electrode is electrically connected to the drain contact sub-portion of one corresponding driving active portion.

In an embodiment of the present invention, in the same driving active portion, a length of the isolation trench along a first direction is smaller than a distance between of the source contact sub-portion and the drain contact sub-portion, and the first direction is a direction from the source contact sub-portion to the drain contact sub-portion.

In an embodiment of the present invention, the length of the isolation trench along the first direction is less than or equal to 3 micrometers.

In an embodiment of the present invention, an orthographic projection of the isolation trench of one driving active portion on the substrate is located within a coverage range of an orthographic projection of one corresponding driving gate on the substrate.

In an embodiment of the present invention, the display panel further comprises a plurality of switching transistors, one of the plurality of switching transistors is electrically connected to one of the plurality of driving transistors, and each of the switching transistors comprises a switching a source portion, a switching gate, and a switching source electrode and a switching drain electrode connected to the switching active portion;

wherein the active layer further comprises a plurality of the switching active portions, the first metal layer further comprises a plurality of the switching gates, the second metal layer further comprises a plurality of the switching sources, a plurality of the switching drains and a plurality of scan lines, the switching active portion comprises a second semiconductor sub-layer, one switching gate is correspondingly located on a side of the switching active portion away from the substrate, one scan line is correspondingly located on a side of the switching gate away from one corresponding switching active portion.

According to an aspect of the present invention described above, an embodiment of the present invention further provides a method of fabricating a display panel, wherein the display panel comprises a plurality of driving transistors, wherein each driving transistor comprises a driving active portion, a driving gate, and a driving source and a driving source connected to the driving active portion, and the method of fabricating the display panel comprises following steps:

providing a substrate;

forming an active layer on the substrate, wherein the active layer comprises a plurality of driving active portions, and each driving active portion comprises a conductor sub-layer and a first semiconductor sub-layer, and wherein, in each driving active portion, the conductor sub-layer comprises a first conductor sub-portion and a second conductor sub-portion arranged at intervals, and the first semiconductor sub-layer is at least connected to the first conductor sub-portion and the second conductor sub-portion;

forming a first metal layer on a side of the active layer away from the substrate, wherein the first metal layer comprises a plurality of driving gates, and one driving gate is correspondingly located on a side of one driving active portion far away from the substrate; and forming a second metal layer on a side of the first metal layer away from the active layer, wherein the second metal layer comprises a plurality of driving source electrodes and a plurality of driving drain electrodes.

According to another aspect of the present invention described above, an embodiment of the present invention further provides a display device, comprising the display panel and a device body, wherein the device body and the display panel are combined into one body.

Beneficial effects of the present invention are that the conductor sub-layer and the first semiconductor sub-layer are arranged in the driving active portion, the conductor sub-layer comprises the first conductor sub-portion and the second conductor sub-portion arranged at intervals, the first semiconductor sub-layer is at least connected to the first conductor sub-portion and the second conductor sub-portion, and a channel can be formed in the region of the driving active portion between the first conductor sub-portion and the second conductor sub-portion. Therefore, a smaller-sized channel can be obtained by the precise photolithography of the conductor sub-layer, so as to obtain a driving transistor with an ultra-short channel, which effectively improves a current passing capability of the driving transistor. In addition, in the present invention, the driving gate is located on the side of the driving active portion away from the substrate, thereby preventing the ions in the film layer on the side of the driving gate away from the driving active portion from diffusing to the driving active portion and affecting the electrical properties of the driving active portion, and the stability and driving effects of the driving transistor can be improved.

BRIEF DESCRIPTION OF DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

FIG. 5 is a flowchart of a method for fabricating a display panel according to an embodiment of the present invention.

DETAILED DESCRIPTION

Figure 1:
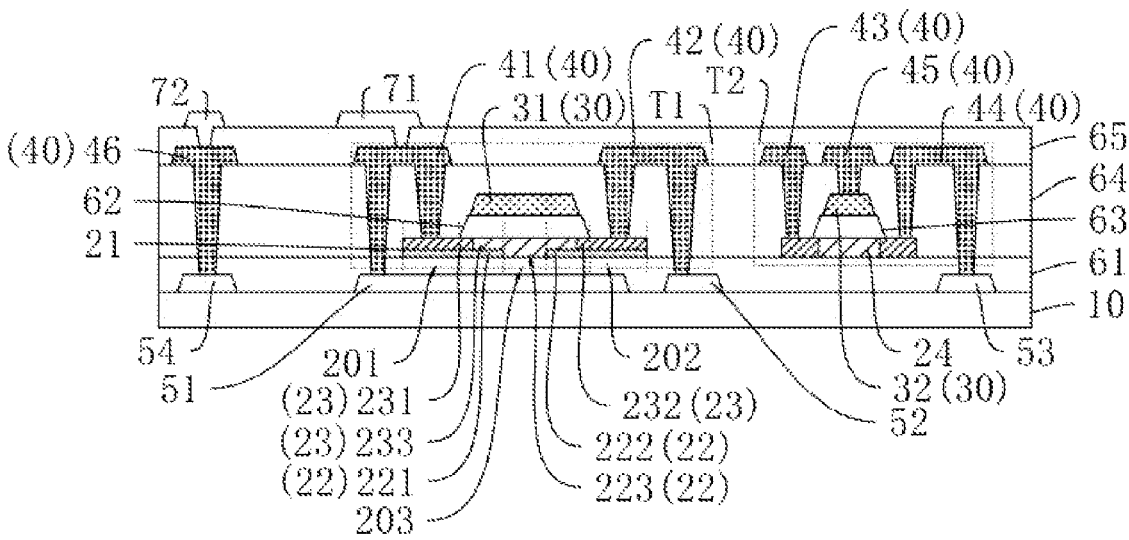
FIG. 1 is a schematic structural diagram of a display panel according to an embodiment of the present invention.

Technical solutions in embodiments of the present invention will be clearly and completely described below with reference to the accompanying drawings in the embodiments of the present invention. Obviously, the described embodiments are only some, but not all, embodiments of the present invention. Based on the embodiments of the present invention, all other embodiments obtained by those skilled in the art without creative efforts shall fall within the protection scope of the present invention.

The following disclosure provides many different embodiments or examples for implementing different structures of the present invention. In order to simplify the disclosure of the present invention, the components and arrangements of specific examples are described below. Of course, they are only examples and are not intended to limit the invention. Furthermore, the present disclosure may repeat reference numerals and/or reference letters in different instances for the purpose of simplicity and clarity and not in itself indicative of a relationship between the various embodiments and/or arrangements discussed. In addition, the present disclosure provides examples of various specific processes and materials, but one of ordinary skill in the art will recognize the application of other processes and/or the use of other materials.

An embodiment of the present invention provides a display panel. Please refer to FIG. 1, the display panel comprises a plurality of driving transistors T1, and each driving transistor T1 comprises a plurality of driving active portions 21, a driving gate 31, and a driving source electrode 41 and a driving drain electrode 42 connected to the plurality of driving active portions 21.

In addition, the display panel further comprises a substrate 10, an active layer, a first metal layer 30 and a second metal layer 40. Herein, the active layer is disposed on the substrate 10 and comprises the plurality of driving active portions 21. Each driving active portion 21 comprises a conductor sub-layer 22 and a first semiconductor sub-layer 23. The first metal layer 30 is disposed on a side of the active layer away from the substrate 10 and comprises a plurality of driving gates 31. One of the driving gates 31 is correspondingly located on a side of the driving active portion 21 away from the substrate 10. The second metal layer 40 is disposed on a side of the first metal layer 30 away from the active layer and comprises a plurality of driving source electrodes 41 and a plurality of driving drain electrodes 42.

Furthermore, in each driving active portion 21, the conductor sub-layer 22 comprises a first conductor sub-portion 221 and a second conductor sub-portion 222 arranged at intervals, and the first semiconductor sub-layer 23 is at least connected to the first conductor sub-portion 221 and the second conductor sub-portion 222.

In the implementation and application process, the conductor sub-layer 22 and the first semiconductor sub-layer 23 in the embodiment of the present invention are arranged in the driving active portion 21, the conductor sub-layer 22 comprises the first conductor sub-portion 221 and the second conductor sub-portion 222 arranged at intervals, the first semiconductor sub-layer 23 is at least connected to the first conductor sub-portion 221 and the second conductor sub-portion 222, and a channel can be formed in the space of the driving active portion 21 between the first conductor sub-portion 221 and the second conductor sub-portion 221. Therefore, a smaller-sized channel can be obtained by the precise photolithography of the conductor sub-layer 22, so as to obtain the driving transistor T1 with an ultra-short channel, which effectively improves the current passing capability of the driving transistor T1. In addition, in the present invention, the driving gate 31 is located on the side of the driving active portion 21 away from the substrate 10, thereby preventing the ions in the film layer on the side of the driving gate 31 away from the driving active portion 21 from diffusing to the driving active portion 21 which affects the electrical properties of the driving active portion 21, and the stability and driving effects of the driving transistor T1 can be improved.

Please continue to refer to FIG. 1. In an embodiment of the present invention, the display panel provided by the embodiment of the present invention comprises a plurality of driving transistors T1 and a plurality of switching transistors T2, and one driving transistor T1 and one switching transistor T2 are electrically connected. It should be noted that each driving transistor T1 comprises a driving active portion 21, a driving gate 31, and a driving source electrode 41 and a driving drain electrode 42 that connects to the driving active portion 21. Each switching transistor T2 comprises a switching active portion 24, a switching gate 32, and a switching source 43 and a switching drain 44 connected to the switching active portion 24.

Furthermore, the display panel further comprises a substrate 10, a third metal layer disposed on the substrate 10, a buffer layer 61 disposed on the substrate 10 and covering the third metal layer, an active layer disposed on the buffer layer 61, a gate insulating layer disposed on the active layer, the first metal layer 30 disposed on the gate insulating layer, an interlayer dielectric layer 64 disposed on the buffer layer 61 to cover the active layer, the gate insulating layer and the first metal layer 30, the second metal layer 40 disposed on the interlayer dielectric layer 64, and a passivation layer 65 disposed on the interlayer dielectric layer 64 to cover the second metal layer 40.

Herein, the third metal layer comprises a light shielding portion 51, a first power signal line 52, a data line 53 and a second power signal line 54.

The active layer comprises a plurality of driving active portions 21 and a plurality of switching active portions 24. Each driving active portion 21 is correspondingly located above one light shielding portion 51.

The gate insulating layer comprises a plurality of driving gate insulating portions 62 and a plurality of switching gate insulating portions 63. Each driving gate insulating portion 62 is correspondingly located on one driving active portion 21, and each switching gate insulating portion 63 is correspondingly located on one switch active portion 24.

The first metal layer 30 comprises a plurality of driving gates 31 and a plurality of switching gates 32. Each driving gate 31 is correspondingly located on a side of a driving gate insulating portion 62 away from a corresponding driving active portion 21, and each switching gate 32 is located on a side of a switch gate insulating portion 63 away from a corresponding switch active portion 24.

The second metal layer 40 comprises a plurality of driving source electrodes 41, a plurality of driving drain electrodes 42, a plurality of switching source electrodes 43, a plurality of switching drain electrodes 44, a plurality of scanning lines 45 and a transferring portion 46. One driving source electrode 41 and one driving drain 42 correspond to one driving active portion 21 and one driving gate 31 to constitute one driving transistor T1. Herein, the driving source electrode 41 and the driving drain electrode 42 are connected to both sides of the driving active portion 21 through via holes passing through the interlayer dielectric layer 64. One switching source electrode 43 and one switching drain electrode 44 correspond to one switching active portion 24 and one switching gate 32 to constitute one switching transistor T2. Herein, the switching source electrode 43 and the switching drain electrode 44 are connected to both sides of the switching active portion 24 through via holes passing through the interlayer dielectric layer 64.

In addition, the driving source electrode 41 passes through the interlayer dielectric layer 64 and the buffer layer 61 and connects the light shielding portion 51 to provide a stable voltage to the light shielding portion 51 for improving a saturation characteristic of output characteristic curve of the driving transistor T1.

The fourth metal layer comprises a first electrode member 71 and a second electrode member 72. The first electrode member 71 connects the driving source electrode 41 through a via hole passing through the passivation layer 65, and the second electrode member 72 connects the transferring portion 46 through a via hole passing through the passivation layer 65.

Specifically, each driving active portion 21 comprises a conductor sub-layer 22 and a first semiconductor sub-layer 23. In each driving active portion 21, the conductor sub-layer 22 comprises a first conductor sub-portion 221 and a second conductor sub-portion 222 that are arranged at intervals, and an isolation trench 223 located between the first conductor sub-portion 221 and the second conductor sub-portion 222. The first semiconductor sub-layer 23 is at least connected between the first conductor sub-portion 221 and the second conductor sub-portion 222. Meanwhile, in the embodiment of the present invention, the first semiconductor sub-layer 23 is at least filled in the isolation trench 223.

Furthermore, each driving active portion 21 comprises a source contact region 201, a drain contact region 202 and a channel region 203 located between the source contact region 201 and the drain contact region 202. Herein, at least the first conductor sub-portion 221 extends to the source contact region 201, at least the second conductor sub-portion 222 extends to the drain contact region 202, and the isolation trench 223 is located in the channel region 203. In the embodiment of the present invention, portions of each driving source electrode 41 and one corresponding driving active portion 21 in the source contact region 201 are electrically connected, and portions of each driving drain electrode 42 and one corresponding driving active portion 21 in the drain contact region 202 are electrically connected.

In this embodiment, the first semiconductor sub-layer 23 comprises a source contact sub-portion 231, a drain contact sub-portion 232, and an intermediate connection section 233 connected between the source contact sub-portion 231 and the drain contact sub-portion 232. The intermediate connection portion 233 is filled in the isolation trench 223 and partially extends to a side of the first conductor sub-portion 221 away from the substrate 10 and a side of the second conductor sub-portion 222 away from the substrate 10. The source contact sub-portion 231 is at least disposed in the source contact region 201 and is located on a side of the first conductor sub-portion 221 away from the substrate 10, and the drain contact sub-portion 232 is at least disposed in the drain contact region 202 and is located on a side of the second conductor sub-portion 222 away from the substrate 10.

It can be understood that the source contact sub-portion 231 and the drain contact sub-portion 232 are the portions of the driving active portion 21 that will be conducted, and the intermediate connection portion 233 is connected between the first conductor sub-portion 221 and the second conductor sub-portion 222 and maintains the semiconductor characteristics. The source contact sub-portion 231 is electrically connected to the first conductor sub-portion 221, and the drain contact sub-portion 232 is electrically connected to the second conductor sub-portion 222.

In this embodiment, the driving source electrode 41 passes through the interlayer dielectric layer 64 to connect the source contact sub-portion 231, and the driving drain electrode 42 passes through the interlayer dielectric layer 64 to connect the drain contact sub-portion 232. Therefore, the driving source electrode 41 is electrically connected to the first conductor sub-portion 221 through the source contact sub-portion 231, the driving drain electrode 42 is electrically connected to the second conductor sub-portion 222 through the drain contact sub-portion 232, and the first conductor sub-portion 221 and the second conductor sub-portion 222 are electrically connected at the isolation trench 223 through the intermediate connection portion 233. Since the intermediate connection portion 233 has semiconductor characteristics, a voltage can be applied by the driving gate 31 so that a current channel can be formed in portions of the intermediate connection portion 233 located at the isolation trench 223, thereby realizing the transmission of electrical signals between the driving source electrode 41 and the driving drain electrode 42.

It should be noted that, in an embodiment of the present invention, an orthographic projection of the intermediate connecting portion 233 of each driving active portion 21 over the substrate 10 is located within a coverage range of an orthographic projection of the corresponding driving gate 31 on the substrate 10, and an orthographic projection of the isolation trench 223 of a driving active portion 21 on the substrate 10 is located within a coverage range of an orthographic projection of a corresponding driving gate 31 on the substrate 10. In the same driving active portion 21, a length of the isolation trench 223 along a first direction is smaller than a distance between the source contact sub-portion 231 and the drain contact sub-portion 232, and the first direction is the direction from the source contact sub-portion 231 to the drain contact sub-portion 232. Furthermore, a length of the isolation trench 223 along the first direction is less than or equal to 3 micrometers and is less than or equal to 2 micrometers.

Preferably, the length of the isolation trench 223 along the first direction is greater than or equal to 2 micrometers and is less than or equal to 2.5 micrometers, and the length of the driving gate 31 along the first direction is greater than or equal to 6 micrometers and id less than or equal to 8 micrometers.

As described the above, in the embodiment of the present invention, the first conductor sub-portion 221 and the second conductor sub-portion 222 in the driving active portion 21 are arranged at intervals, and the intermediate connection portion 233 is connected to the first conductor sub-portion 221 and the second conductor section 221. Therefore, a channel can be formed in the region between the first conductor sub-portion 221 and the second conductor sub-portion 222 of the driving active portion 21, and the conductor sub-layer 22 can be precisely patterned by a photolithography process. Therefore, a channel with a smaller size can be obtained by the precise photolithography of the conductor sub-layer 22 to obtain the driving transistor T1 with an ultra-short channel. In the embodiment of the present invention, a channel length of the driving transistor T1 can be reduced to less than 3 micrometers. Compared with the prior art, the channel length is generally similar to the gate length, which is generally about 8 micrometers. Furthermore, the embodiment of the present invention can effectively improve the current passing capability of the driving transistor T1, and can increase the current passing capability of the driving transistor T1 by 220% to 300%. In addition, in the embodiment of the present invention, the driving gate 31 is located on the side of the driving active portion 21 away from the substrate 10, thereby preventing ions in the film layer on the side of the driving gate 31 away from the driving active portion 21 from diffusing to the driving active portion 21 and affecting the electrical properties of the driving active portion 21, which can improve the stability and driving effects of the driving transistor T1. Furthermore, the embodiment of the present invention can reduce the channel length of the driving transistor T1, thereby reducing the size of the driving transistor T1 and saving more space, so as to arrange more pixels and improve the resolution of the display panel.

Furthermore, each switching transistor T2 is electrically connected to a driving transistor T1, and each switching transistor T2 comprises a switching active portion 24 disposed in the active layer, a switching gate 32 disposed in the first metal layer 30, a switching source electrode 43 and a switching drain electrode 44 disposed in the second metal layer 40. Herein, the switching active portion 24 comprises a second semiconductor sub-layer, and the switching gate 32 is located on the side of the switching gate insulating portion 63 away from the corresponding switching active portion 24, and the switching source electrode 43 and the switching drain electrode 44 connect both sides of the switching active portion 24 through via holes in the interlayer dielectric layer 64, and the above structure can be realized with reference to conventional processes, which will not be repeated here.

In the embodiment of the present invention, the second metal layer 40 further comprises a plurality of scan lines 45, and each scan line 45 is located on a side of a switching gate 32 away from corresponding switching active portion 24. Therefore, the switching gate 32 and the metal structures on both sides of the scan line 45 can be formed on the side of the switching active portion 24 away from the substrate 10, which can effectively prevent the ions such as hydrogen ions in the film layer on the side of the scan line 45 away from the substrate 10 from diffusing to the switching active portion 24, prevent the electrical properties of the switching active portion 24 from being affected and improve the driving stability of the switching transistor T2.

Figure 2:
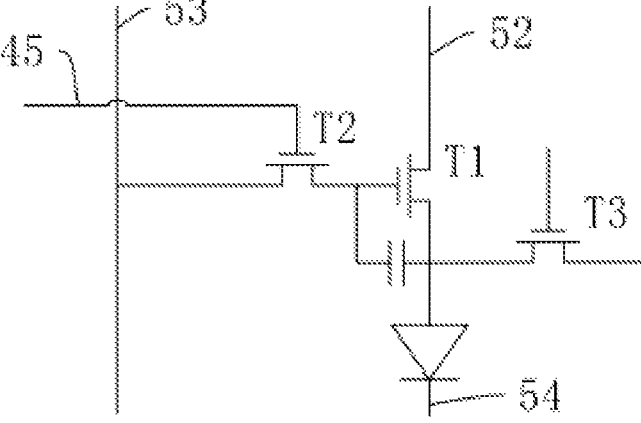
FIG. 2 is a schematic diagram of a 3T1C pixel driving circuit according to an embodiment of the present invention.

Furthermore, a circuit connection structure of the driving transistor T1 and the switching transistor T2 in an embodiment of the present invention will be described below. Please refer to FIG. 1 and FIG. 2.

Specifically, the switching drain electrode 44 of the switching transistor T2 is connected to the data line 53, the switching source electrode 43 is connected to the driving gate 31 of the driving transistor T1, the switching gate 32 is connected to the scan line 45, the driving drain electrode 42 of the driving transistor T1 is connected to the first power signal line 52, and the driving source electrode 41 is connected to the first electrode member 71, so that the electrical signals in the first power signal line 52 can be transmitted to the first electrode member 71. The display panel further comprises a sensing transistor T3, a gate of the sensing transistor T3 is connected to a sensing signal line, a source of the sensing transistor T3 is connected to the driving source 41 of the driving transistor T1, and a drain of the sensing transistor T3 can be connected to a detection module to detect the actual current value passing through the first electrode member 71 to generate a compensation voltage. The second power signal line 54 transmits the electrical signals to the second electrode member 72 through the transferring portion 46. The above processes can work with reference to the principle of a conventional 3T1C pixel driving circuit, which will not be repeated here.

It should be noted that, in the embodiment of the present invention, the positions of the driving source electrode 41 and the driving drain electrode 42 can be interchanged, and the positions of the switching source electrode 43 and the switching drain electrode 44 can also be interchanged, which can be made based on actual needs, which is not limited here.

The display panel provided in the embodiment of the present invention can be used for OLED displays, Micro LED displays and Mini LED displays. When the display panel is used for OLED displays, the first electrode member 71 can be an anode in the OLED light-emitting device, and the second electrode member 72 can be a signal terminal in the non-display area of the display panel and is connected to the cathode of the OLED light-emitting device. When the display panel is used for a Micro LED display or a Mini LED display, the first electrode member 71 can be connected to a positive terminal of the LED chip, and the second electrode member 72 can be connected to a negative terminal of the LED chip.

As described above, in the embodiment of the present invention, the conductor sub-layer 22 and the first semiconductor sub-layer 23 are arranged in the driving active portion 21, the conductor sub-layer 22 comprises the first conductor sub-portion 221 and the second conductor sub-layer 222 arranged at intervals, the first semiconductor sub-layer 23 is at least connected between the first conductor sub-portion 221 and the second conductor sub-portion 222, and a channel is formed in the region between the first conductor sub-portion 221 and the second conductor sub-portion 222 of the driving active portion 21. Therefore, a channel with a smaller size can be obtained by the precise photolithography of the conductor sub-layer 22 to obtain a driving transistor T1 with an ultra-short channel, which effectively improves the current passing capability of the driving transistor T1. In addition, in the present invention, the driving gate 31 is located on the side of the driving active portion 21 away from the substrate 10, thereby preventing ions in the film layer on the side of the driving gate 31 away from the driving active portion 21 from diffusing to the driving active portion 21 and affecting the electrical properties of the driving active portion 21, thereby improving the stability and driving effects of the driving transistor T1.

Figure 3:
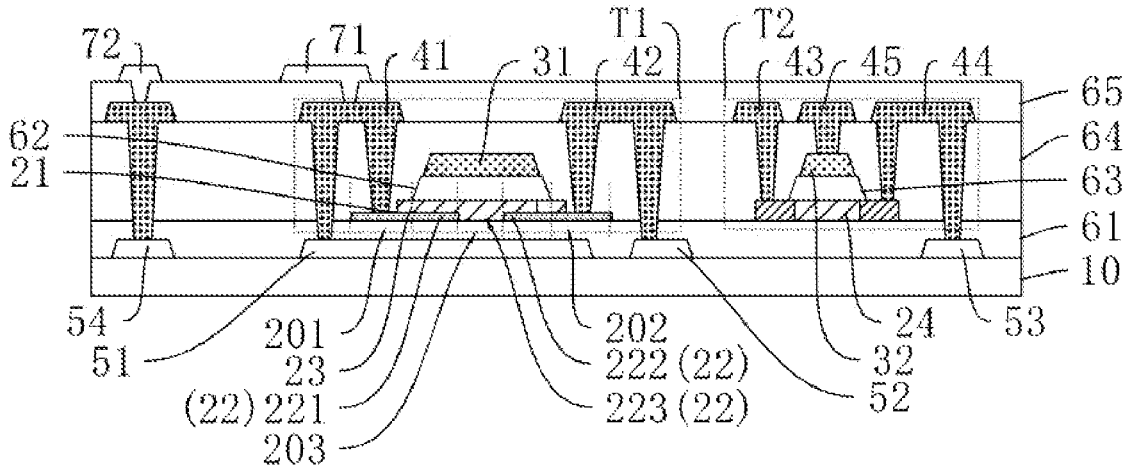
FIG. 3 is another schematic structural diagram of a display panel provided by an embodiment of the present invention.

In another embodiment of the present invention, please refer to FIG. 3, the differences between this embodiment and the previous embodiment are that an end of the first conductor sub-portion 221 in the source contact region 201 is located at a side of the first semiconductor sub-layer 23 away from the isolation trench 223, an end of the second conductor sub-portion 222 in the drain contact region 202 is located at a side of the first semiconductor sub-layer 23 away from the isolation trench 223, the driving source electrode 41 passes through the interlayer dielectric layer 64 to electrically connect the first conductor sub-portion 221, and the driving drain electrode 42 passes through the interlayer dielectric layer 64 to electrically connect the second conductor sub-portion 222.

In addition, the first semiconductor sub-layer 23 is at least filled in the isolation trench 223, partially extends to the side of the first conductor sub-portion 221 away from the substrate 10 and extends to the side of the second conductor sub-portion 222 away from the substrate 10. The first semiconductor sub-layer 23 may partially extend into the source contact region 201 and the drain contact region 202, or may be located outside the source contact region 201 and outside the drain contact region 202, which is not limited herein.

In an embodiment of the present invention, the conductor sub-layer 22 and the first semiconductor sub-layer 23 are arranged in the driving active portion 21, the conductor sub-layer 22 comprises the first conductor sub-portion 221 and the second conductor sub-portion 222 of the second conductor sub-layer 22 arranged at intervals, the first semiconductor sub-layer 23 is at least connected between the first conductor sub-portion 221 and the second conductor sub-portion 222, and a channel can be formed in the region between the first conductor sub-portion 221 and the second conductor sub-portion 222 of the driving active portion 21. Therefore, a smaller-sized channel can be obtained by the precise photolithography of the conductor sub-layer 22, so as to obtain a driving transistor T1 with an ultra-short channel, and effectively improve the current of the driving transistor T1. In addition, in the present invention, the driving gate 31 is located on the side of the driving active portion 21 away from the substrate 10, thereby preventing ions in the film layer on the side of the driving gate 31 away from the driving active portion 21 from diffusing to the driving active portion 21 to affect electrical characteristics of the driving active portion 21, which can improve the stability and driving effect of the driving transistor T1. Compared with the previous embodiment, in this embodiment, both ends of the first semiconductor sub-layer 23 do not need to be connected to the driving source electrode 41 and the driving drain electrode 42, and thus the first semiconductor sub-layer 23 does not need to be conducted, which can simplify the process and reduce the cost.

Figure 4:
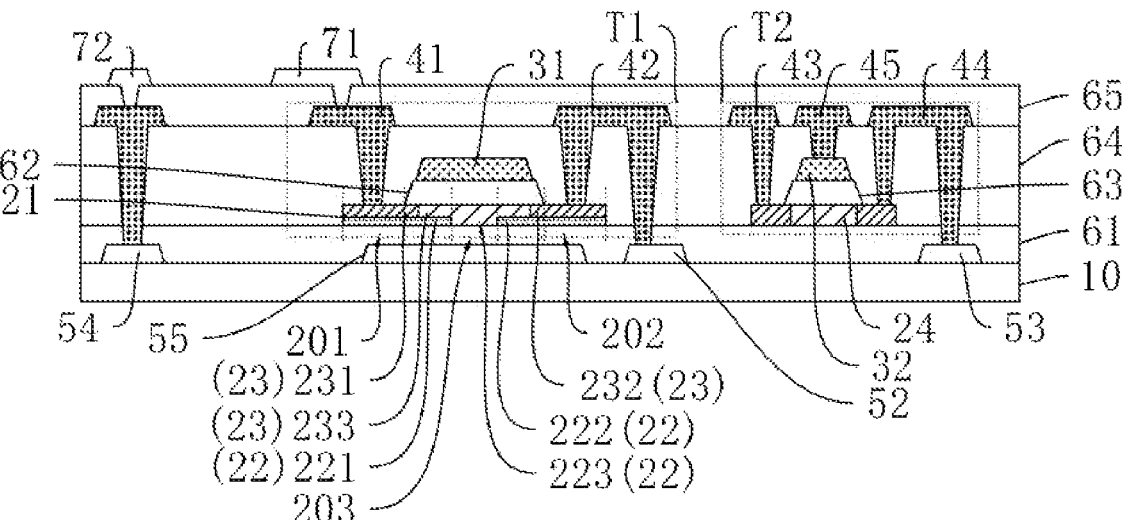
FIG. 4 is yet another schematic structural diagram of a display panel provided by an embodiment of the present invention.
Figure 6:
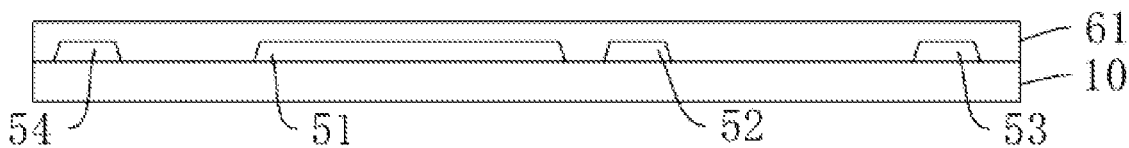
FIGS. 6, 7, 8, 9, 10, 11 and 12 are schematic structural diagrams of a method of fabricating a display panel according to an embodiment of the present invention.
Figure 7:
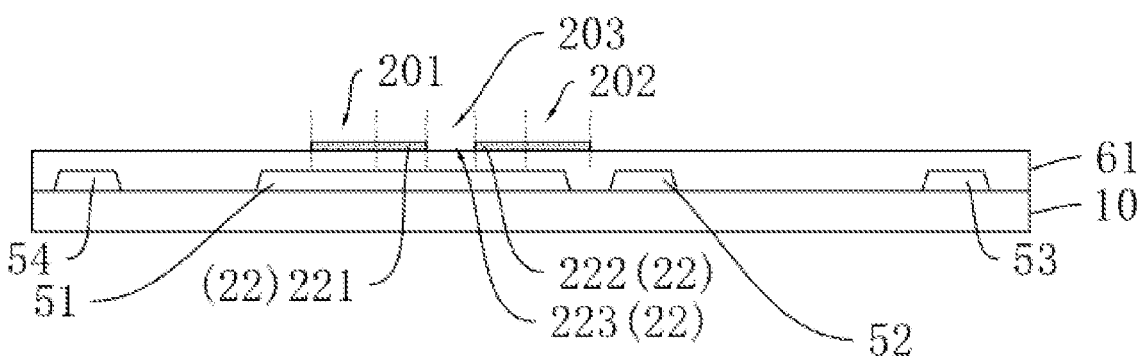
Figure 8:
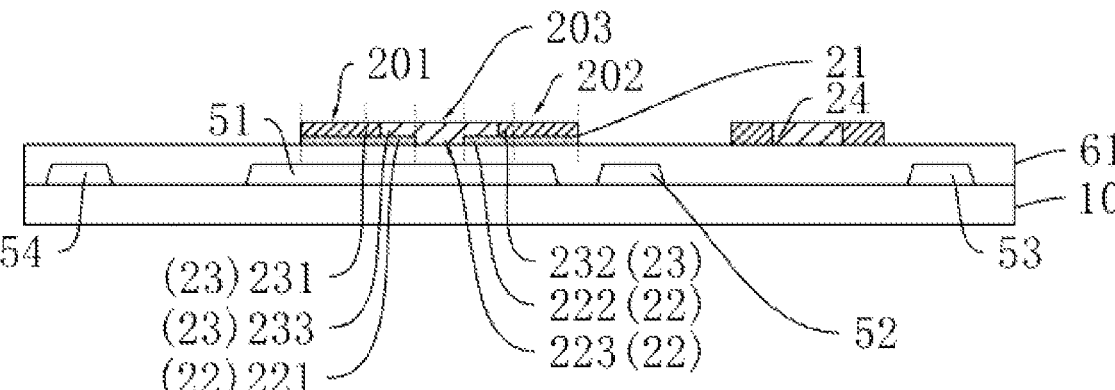
Figure 9:
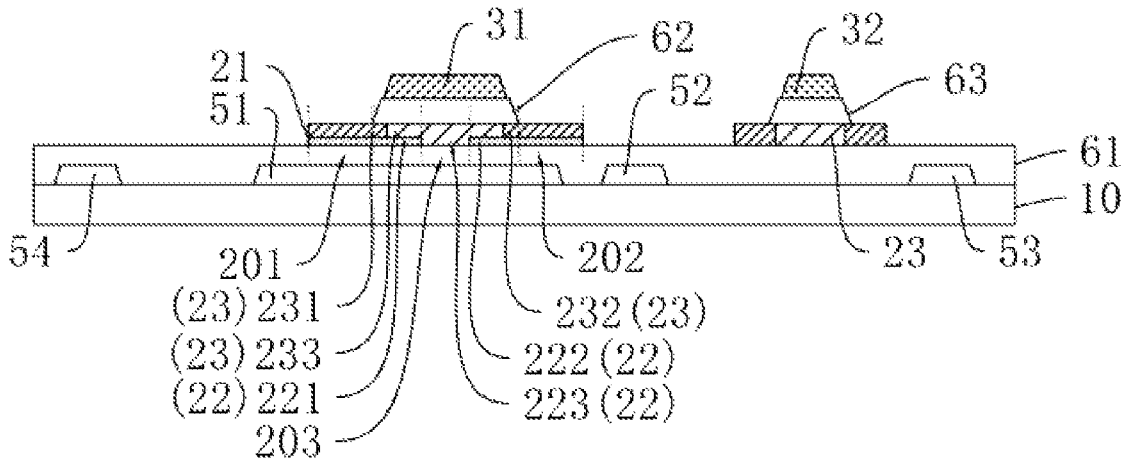
Figure 10:
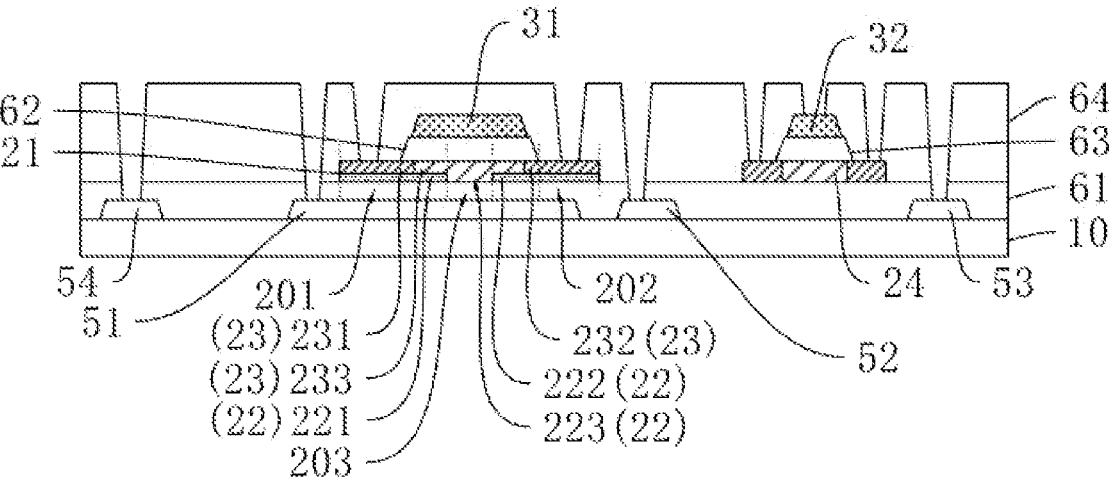
Figure 11:
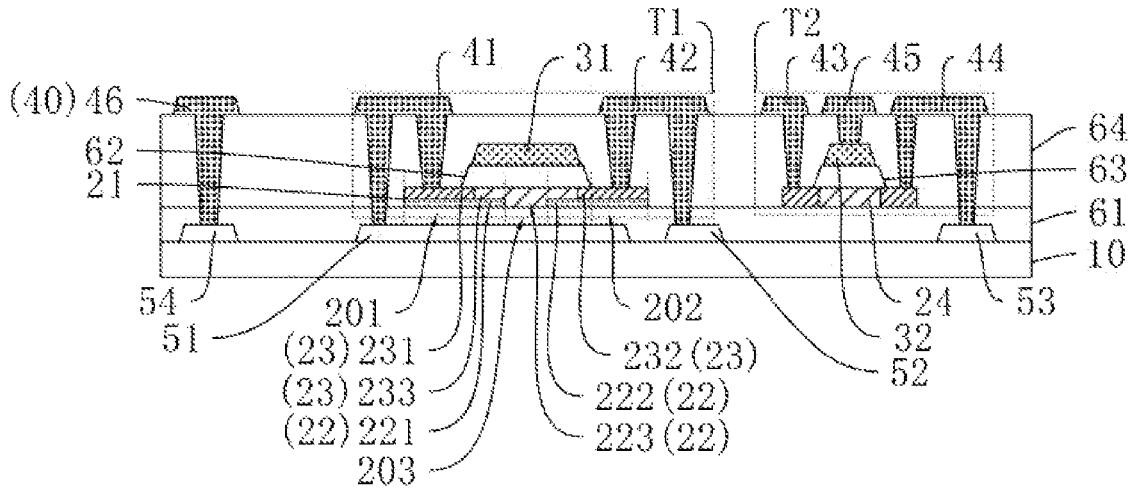
Figure 12:
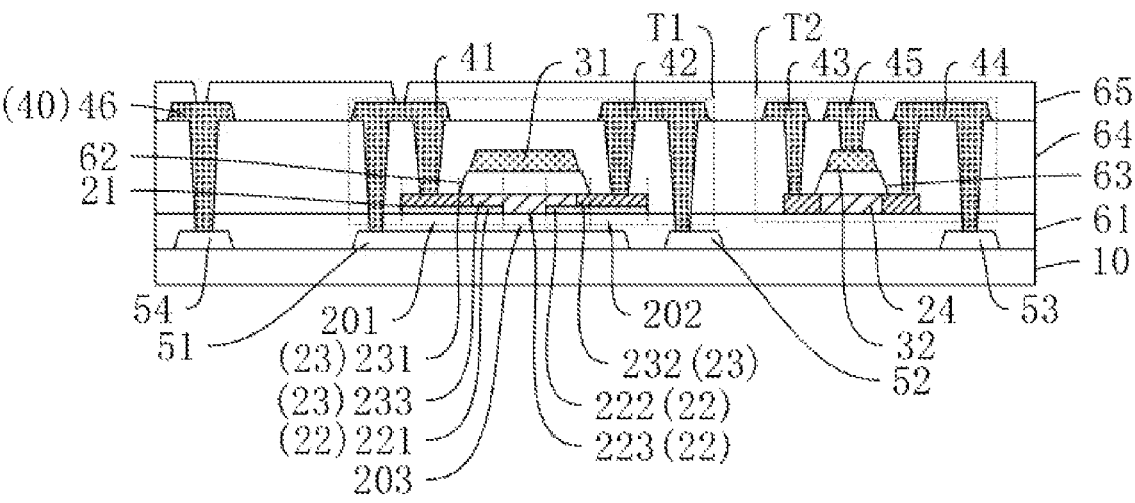

In another embodiment of the present invention, please refer to FIG. 4, differences between this embodiment and the first embodiment are that the third metal layer comprises a plurality of bottom gates 55, a first power signal line 52, a data line 53 and a second power signal line 54.

Herein, each bottom gate 55 is located between one driving active portion 21 and the substrate 10, and each bottom gate 55 and one corresponding driving gate 31 can maintain the same potential.

As described above, in the embodiment of the present invention, the conductor sub-layer 22 and the first semiconductor sub-layer 23 are provided in the driving active portion 21, the conductor sub-layer 22 comprises the first conductor sub-portion 221 and the second conductor sub-portion 222 arranged at intervals, the first semiconductor sub-layer 23 is at least connected to the first conductor sub-portion 221 and the second conductor sub-portion 222, a channel is formed in the isolated region between the first conductor sub-portion 221 and the second conductor sub-portion 222 of the driving active portion 21, and a smaller-sized channel can be obtained by the precise photolithography of the conductor sub-layer 22, so as to obtain a driving transistor T1 with an ultra-short channel, which effectively improves the current passing capability of the driving transistor T1. In addition, in the present invention, the driving gate 31 is located on the side of the driving active portion 21 away from the substrate 10, thereby preventing ions in the film layer on the side of the driving gate 31 away from the driving active portion 21 from diffusing into the driving active portion 21 and affecting electrical properties of the driving active portion 21, thereby improving the stability and driving effects of the driving transistor T1.

In addition, an embodiment of the present invention also provides a method of fabricating a display panel described in the above-mentioned embodiments. Please refer to FIG. 1, FIG. 5, and FIG. 6 to FIG. 12. The display panel comprises a plurality of driving transistors T1, and each driving transistor T1 comprises a driving active portion 21, a driving gate 31, and a driving source 41 and a driving drain 42 that connect the driving active portion 21.

The method of fabricating the display panel comprises following steps.

S10: providing the substrate 10.

A substrate 10 is provided, and the substrate 10 may be a glass substrate or a polyimide flexible substrate, which is not limited herein.

S20: forming an active layer on the substrate 10. The active layer comprises a plurality of driving active portions 21, and each driving active portion 21 comprises a conductor sub-layer 22 and a first semiconductor sub-layer 23. Herein, in each driving active portion 21, the conductor sub-layer 22 comprises a first conductor sub-portion 221 and a second conductor sub-portion 222 arranged at intervals, and the first semiconductor sub-layer 23 is at least connected to the first conductor sub-portion 221 and the second conductor sub-portion 222.

A first metal material layer is formed on the substrate 10, and the first metal material layer is patterned to obtain a third metal layer. The third metal layer comprises a plurality of light shielding portions 51, a first power signal line 52, a data line 53 and the second power signal line 54.

Optionally, the material of the first metal material layer may comprise Mo, or Mo/Al, or Mo/Cu, or MoTi/Cu, or IZO/Cu, or Mo/Cu/MoTiNi, or Ni/Cu/Ni, or MoTiNi/Cu/MoTiNi, or NiCr/Cu/NiCr, or CuNb, etc.

A buffer layer 61 is formed on the third metal layer, and the buffer layer 61 covers the plurality of light shielding portions 51, the first power signal line 52, the data line 53 and the second power signal line 54.

Optionally, the material of the buffer layer 61 may comprise SiOx, or SiNx, or SiNx/SiOx, or SiNOx, or the like.

An active layer is formed on the buffer layer 61, and the active layer comprises a plurality of driving active portions 21 and a plurality of switching active portions 24. Each driving active portion 21 is correspondingly located above a light-shielding portion 51, and specifically comprises following steps.

First, a conductor material layer is formed on the buffer layer 61, and the conductor material layer is patterned to obtain conductor sub-layers 22, and each conductor sub-layer 22 comprises a first conductor sub-portion 221 and a second conductor sub-portion 222 arranged at intervals, and an isolation trench 223 is located between the first conductor sub-portion 221 and the second conductor sub-portion 222.

Optionally, the material of the conductor material layer may comprise at least one of ITO, IZO, AZO, Mo, Ti and MoTi.

Next, a semiconductor material layer is formed on the buffer layer 61, and the semiconductor material is patterned to obtain a first semiconductor sub-layer 23 and a second semiconductor layer. Herein, the first semiconductor sub-layer 23 is at least connected between the first conductor sub-portion 221 and the second conductor sub-portion 222. In the embodiment of the present invention, the first semiconductor sub-layer 23 is filled in the isolation trench 223 and partially extends to the side of the first conductor sub-portion 221 away from the substrate 10 and extends to the side of the second conductor sub-portion 222 away from the substrate 10.

Optionally, the material of the semiconductor material layer may comprise at least one of IGZO, IGTO, IGZO, IGO, IZO and AIZO.

The conductor sub-layer 22 and the first semiconductor sub-layer 23 are stacked to form the driving active portion 21, and the second semiconductor sub-layer forms the switching active portion 24.

It should be noted that, in the embodiment of the present invention, the photolithography process can be used to obtain the conductor sub-layer 22, and the photolithography process can precisely control the patterning of the conductor sub-layer 22, thereby precisely controlling a length of the isolation trench 223 along a direction from the first conductor sub-portion 221 to the second conductor sub-portion 222 that the length becomes smaller to obtain the driving transistor T1 with an ultra-short channel.

Optionally, the length of the isolation trench 223 along the direction from the first conductor sub-portion 221 to the second conductor sub-portion 222 is less than or equal to 3 micrometers, and is less than or equal to 2 micrometers.

Preferably, the length of the isolation trench 223 along the direction from the first conductor sub-portion 221 to the second conductor sub-portion 222 is greater than or equal to 2 micrometers, and is less than or equal to 2.5 micrometers.

S30: forming a first metal layer 30 on the side of the active layer away from the substrate 10. The first metal layer 30 comprises a plurality of driving gates 31, and one driving gate 31 is correspondingly located on a side of one driving active portion 21 far away from the substrate 10.

An insulating material layer is formed on the active layer, and then a gate metal layer is formed on the insulating material layer.

Optionally, the material of the insulating material layer may comprise SiOx, or SiNx, or $Al_2O_3$/SiNx/SiOx, or SiOx/SiNx/SiOx, etc.; the material of the gate metal layer may comprise Mo, or Mo/Al, or Mo/Cu, or Mo/Cu/IZO, or IZO/Cu/IZO, or Mo/Cu/ITO, or Ni/Cu/Ni, or MoTiNi/Cu/MoTiNi, or NiCr/Cu/NiCr or CuNb, etc.

Next, the gate metal layer is patterned to obtain a first metal layer 30, and the first metal layer 30 comprises a plurality of driving gates 31 and a plurality of switching gates 32. Herein, one driving gates located corresponding to one driving active portion 21 that is located on the side away from the substrate 10 and one switching gate 32 is correspondingly located on the side of the switching active portion 24 away from the substrate 10.

S40: forming a second metal layer 40 on the side of the first metal layer 30 away from the active layer, and the second metal layer 40 comprises a plurality of driving source electrodes 41 and a plurality of driving drain electrodes 42.

As described above, the insulating material layer is patterned by self-aligning using the driving gates 31 and the switching gates 32 to obtain the driving gate insulating portion 62 between the driving gate 31 and the driving active portion 21 and the switching gate insulating portion 63 between the switching gate 32 and the switching active portion 24.

Next, conductive processing is performed on the positions where the driving active portion 21 and the switching active portion 24 for connecting the source and drain. It should be noted that the driving active portion 21 comprises a source contact region 20, a drain contact region 202 and a channel region 203 located between the source contact region 201 and the drain contact region 202. In the embodiment of the present invention, the first conductor sub-portion 221 extends into the source contact region 201, the second conductor sub-portion 222 extends into the drain contact region 202, and the first semiconductor sub-layer 23 comprises the source contact sub-portion 231 that is at least disposed in the source contact region 201 and located on the side of the first conductor sub-portion 221 away from the substrate 10, the drain contact sub-portion 232 at least disposed in the drain contact region 202 and located on the side of the second conductor sub-portion 222 away from the substrate 10, and the source contact sub-portion 231 and the drain contact sub-portion 232 are obtained by conducting semiconductor material through conducting treatments.

An interlayer dielectric layer 64 is formed on the first metal layer 30, and the interlayer dielectric layer 64 and the buffer layer 61 are patterned to obtain a plurality of via holes.

Optionally, the material of the interlayer dielectric layer 64 may comprise at least one of SiOx, SiNx, and SiNOx.

A source-drain metal layer is formed on the interlayer dielectric layer 64, and the source-drain metal layer is patterned to obtain a second metal layer 40. The second metal layer 40 comprises a plurality of driving source electrodes 41, a plurality of driving drain electrodes 42, a plurality of switching source electrodes 43, a plurality of switching drain electrodes 44, a plurality of scan lines 45, and a transferring portion 46. Herein, one driving source electrode 41 and one driving drain electrode 42 corresponds to one driving gate 31 and one driving active portion 21 to form a driving transistor T1. The driving source electrode 41 is electrically connected to the source contact sub-portion 231 through a via hole passing through the interlayer dielectric layer 64, and is electrically connected to the light shielding portion 51 through the via holes passing through the interlayer dielectric layer 64 and of the buffer layer 61. The driving drain electrode 42 is electrically connected to the drain contact sub-portion 232 through the via holes passing through the interlayer dielectric layer 64, and is electrically connected to the first power signal line 52 through the via holes pass through the interlayer dielectric layer 64 and of the buffer layer 61. The switching source electrode 43 is electrically connected to the switching active portion 24 through the via hole passing through the interlayer dielectric layer 64, and the switching drain electrode 44 is electrically connected to the switching active portion 24 through the via hole passing through the interlayer dielectric layer 64. The via hole passing through the interlayer dielectric layer 64 is electrically connected to the switching active portion 24, and the via hole passing through the interlayer dielectric layer 64 and the buffer layer 61 is electrically connected to the data line 53.

A passivation layer 65 is formed on the second metal layer 40, and the passivation layer 65 is patterned to obtain a plurality of via holes.

Optionally, the material of the passivation layer 65 may comprise at least one of SiOx, SiNx and SiNOx.

An electrode metal material layer is formed on the passivation layer 65, and the electrode metal material is patterned to obtain a fourth metal layer. The fourth metal layer comprises a first electrode member 71 and a second electrode member 72. The first electrode member 71 is electrically connected to the driving source electrode 41 through the via hole passing through the passivation layer 65, and the second electrode member 72 is electrically connected to the connecting portion 46 through the via hole passing through the passivation layer 65.

As described above, in the embodiment of the present invention, the conductor sub-layer 22 and the first semiconductor sub-layer 23 are arranged in the driving active portion 21, the conductor sub-layer 22 comprises the first conductor sub-portion 221 and the second conductor sub-portion 222 arranged at intervals, the first semiconductor sub-layer 23 is at least connected to the first conductor sub-portion 221 and the second conductor sub-portion 222, and a channel can be formed in the region of the driving active portion 21 between the first conductor sub-portion 221 and the second conductor sub-portion 221. Therefore, a smaller-sized channel can be obtained by the precise photolithography of the conductor sub-layer 22, so as to obtain a driving transistor T1 with an ultra-short channel, which effectively improves a current passing capability of the driving transistor T1. In addition, in the present invention, the driving gate 31 is located on the side of the driving active portion 21 away from the substrate 10, thereby preventing the ions in the film layer on the side of the driving gate 31 away from the driving active portion 21 from diffusing to the driving active portion 21 and affecting the electrical properties of the driving active portion 21, and the stability and driving effects of the driving transistor T1 can be improved.

In addition, an embodiment of the present invention also provides a display device, the display device comprises a display panel and a device main body, and the device main body and the display panel are combined into one body.

In the embodiment of the present invention, the display panel may be the display panel described in the above-mentioned embodiments, and the device main body may comprise a frame, a driving module, and the like.

The display device may be a display terminal such as a mobile phone, a tablet, a TV, etc., which is not limited here.

In the above-mentioned embodiments, the description of each embodiment has its own emphasis. For parts that are not described in detail in a certain embodiment, reference may be made to the relevant descriptions of other embodiments.

A display panel, a method of fabricating the same, and a display device provided by the embodiments of the present invention have been described above in detail. In this paper, specific examples are used to illustrate the principles and implementations of the present invention. The descriptions of the above embodiments are only used for Help to understand the technical solution of the present invention and its core idea; those of ordinary skill in the art should understand: it can still modify the technical solutions recorded in the foregoing embodiments, or perform equivalent replacements to some of the technical features; and these modifications Or alternatively, the essence of the corresponding technical solution does not deviate from the scope of the technical solutions of the embodiments of the present invention.

What is claimed is:

1. A display panel, comprising:
a plurality of driving transistors, wherein each driving transistor comprises a driving active portion, a driving gate, and a driving source electrode and a driving drain electrode connected to the driving active portion;
a substrate;
an active layer disposed on the substrate, wherein the active layer comprises a plurality of driving active portions, and each of the driving active portions comprises a conductor sub-layer and a first semiconductor sub-layer;
a first metal layer disposed on a side of the active layer away from the substrate, wherein the first metal layer comprises a plurality of driving gates, one driving gate is correspondingly located on a side of the driving active portion away from the substrate;
a second metal layer disposed on a side of the first metal layer away from the active layer, wherein the second metal layer comprises a plurality of driving source electrodes and a plurality of driving drain electrodes;
wherein, in each of the driving active portions, the conductor sub-layer comprises a first conductor sub-portion and a second conductor sub-portion arranged at intervals, and an isolation trench located between the first conductor sub-portion and the second conductor sub-portion, the first semiconductor sub-layer is filled in the isolation trench, partially extends to and covers a side of the first conductor sub-portion away from the substrate and partially extends to and covers a side of the second conductor sub-portion away from the substrate, the first semiconductor sub-layer is at least connected to the first conductor sub-layer section and the second conductor sub-portion, and wherein the first semiconductor sub-layer comprises a source contact sub-portion located on a side of the first conductor sub-portion away from the substrate, and a drain contact sub-portion located on a side of the second conductor sub-portion away from the substrate.

2. The display panel according to claim 1, wherein each driving active portion comprises a source contact region, a drain contact region, and a channel region located between the source contact region and the drain contact region, and the isolation trench is located in the channel region;
wherein at least the first conductor sub-portion extends to the source contact region, and at least the second conductor sub-portion extends to the drain contact area.

3. The display panel according to claim 2, wherein one driving source electrode is electrically connected to the first conductor sub-portion of one corresponding driving active portion, and one driving drain electrode is electrically connected with the second conductor sub-portion of one corresponding driving active portion.

4. The display panel according to claim 2, wherein one driving source electrode is electrically connected to a portion of the driving active portion located in the source contact region, and one driving drain electrode is electrically connected to a portion of the driving active portion located in the drain contact region.

5. The display panel according to claim 4, wherein the first semiconductor sub-layer partially extends to the source contact region and the drain contact region, the source contact sub-portion is at least disposed in the source contact region, and the drain contact sub-portion is at least disposed in the drain contact region, the source contact sub-portion is electrically connected to the first conductor sub-portion, and the drain contact sub-portion is electrically connected to the second conductor sub-portion.

6. The display panel according to claim 5, wherein one driving source electrode is electrically connected to the source contact sub-portion of one corresponding driving active portion, and one driving drain electrode is electrically connected to the drain contact sub-portion of one corresponding driving active portion.

7. The display panel according to claim 5, wherein, in the same driving active portion, a length of the isolation trench along a first direction is smaller than a distance between of the source contact sub-portion and the drain contact sub-portion, and the first direction is a direction from the source contact sub-portion to the drain contact sub-portion.

8. The display panel according to claim 7, wherein the length of the isolation trench along the first direction is less than or equal to 3 micrometers.

9. The display panel according to claim 2, wherein an orthographic projection of the isolation trench of one driving active portion on the substrate is located within a coverage range of an orthographic projection of one corresponding driving gate on the substrate.

10. The display panel according to claim 1, wherein the display panel further comprises a plurality of switching transistors, one of the plurality of switching transistors is electrically connected to one of the plurality of driving transistors, and each of the switching transistors comprises a switching a source portion, a switching gate, and a switching source electrode and a switching drain electrode connected to the switching active portion;
wherein the active layer further comprises a plurality of the switching active portions, the first metal layer further comprises a plurality of the switching gates, the second metal layer further comprises a plurality of the switching sources, a plurality of the switching drains and a plurality of scan lines, the switching active portion comprises a second semiconductor sub-layer, one switching gate is correspondingly located on a side of the switching active portion away from the substrate, one scan line is correspondingly located on a side of the switching gate away from one corresponding switching active portion.

11. A method of fabricating a display panel, wherein the display panel comprises a plurality of driving transistors, wherein each driving transistor comprises a driving active portion, a driving gate, and a driving source and a driving source connected to the driving active portion, and the method of fabricating the display panel comprises following steps:
providing a substrate;
forming an active layer on the substrate, wherein the active layer comprises a plurality of driving active portions, and each driving active portion comprises a conductor sub-layer and a first semiconductor sub-layer, and wherein, in each driving active portion, the conductor sub-layer comprises a first conductor sub-portion and a second conductor sub-portion arranged at intervals, and an isolation trench located between the first conductor sub-portion and the second conductor sub-portion, the first semiconductor sub-layer is filled in the isolation trench, partially extends to and covers a side of the first conductor sub-portion away from the substrate and partially extends to and covers a side of the second conductor sub-portion away from the substrate, and the first semiconductor sub-layer is at least connected to the first conductor sub-portion and the second conductor sub-portion;

forming a first metal layer on a side of the active layer away from the substrate, wherein the first metal layer comprises a plurality of driving gates, and one driving gate is correspondingly located on a side of one driving active portion far away from the substrate; and forming a second metal layer on a side of the first metal layer away from the active layer, wherein the second metal layer comprises a plurality of driving source electrodes and a plurality of driving drain electrodes, and wherein the first semiconductor sub-layer comprises a source contact sub-portion located on a side of the first conductor sub-portion away from the substrate, and a drain contact sub-portion located on a side of the second conductor sub-portion away from the substrate.

12. A display device, comprising the display panel according to claim 1 and a device body, wherein the device body and the display panel are combined into one body.

13. A display panel, comprising:

a plurality of driving transistors, wherein each driving transistor comprises a driving active portion, a driving gate, and a driving source electrode and a driving drain electrode connected to the driving active portion;

a substrate;

an active layer disposed on the substrate, wherein the active layer comprises a plurality of driving active portions, and each of the driving active portions comprises a conductor sub-layer and a first semiconductor sub-layer;

a first metal layer disposed on a side of the active layer away from the substrate, wherein the first metal layer comprises a plurality of driving gates, one driving gate is correspondingly located on a side of the driving active portion away from the substrate;

a second metal layer disposed on a side of the first metal layer away from the active layer, wherein the second metal layer comprises a plurality of driving source electrodes and a plurality of driving drain electrodes;

wherein, in each of the driving active portions, the conductor sub-layer comprises a first conductor sub-portion and a second conductor sub-portion arranged at intervals, and an isolation trench located between the first conductor sub-portion and the second conductor sub-portion, the first semiconductor sub-layer is at least connected to the first conductor sub-layer section and the second conductor sub-portion, the first semiconductor sub-layer comprises a source contact sub-portion located on a side of the first conductor sub-portion away from the substrate, and a drain contact sub-portion located on a side of the second conductor sub-portion away from the substrate, wherein, in the same driving active portion, a length of the isolation trench along a first direction is smaller than a distance between of the source contact sub-portion and the drain contact sub-portion, and the first direction is a direction from the source contact sub-portion to the drain contact sub-portion.

14. The display panel according to claim 13, wherein the length of the isolation trench along the first direction is less than or equal to 3 micrometers.

*    *    *    *    *